United States Patent
Ranjan et al.

(10) Patent No.: US 10,998,018 B1
(45) Date of Patent: May 4, 2021

(54) APPARATUS AND METHODS FOR COMPENSATING FOR VARIATIONS IN FABRICATION PROCESS OF COMPONENT(S) IN A MEMORY

(71) Applicant: SAMSUNG ELECTRONICS CO., LTD., Suwon-si (KR)

(72) Inventors: Shubham Ranjan, Banswara (IN); Parvinder Kumar Rana, Bengaluru (IN); Janardhan Achanta, Bengaluru (IN); Manish Chandra Joshi, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/746,378

(22) Filed: Jan. 17, 2020

(30) Foreign Application Priority Data

Oct. 15, 2019 (IN) .............................. 201941041746

(51) Int. Cl.
*G11C 7/12* (2006.01)
*G11C 7/10* (2006.01)

(52) U.S. Cl.
CPC .............. *G11C 7/12* (2013.01); *G11C 7/1063* (2013.01); *G11C 7/1069* (2013.01)

(58) Field of Classification Search
CPC ........ G11C 7/12; G11C 7/1069; G11C 7/1063
USPC .................................................... 365/210.11
See application file for complete search history.

(56) References Cited

U.S. PATENT DOCUMENTS

| | | | |
|---|---|---|---|
| 9,818,474 B2 | 11/2017 | Hsu | |
| 10,593,395 B2 * | 3/2020 | Cosemans | ............. G11C 11/419 |
| 2017/0069361 A1 | 3/2017 | Van Winkelhoff et al. | |
| 2020/0051619 A1 * | 2/2020 | Yamagami | ............ G11C 11/412 |

* cited by examiner

*Primary Examiner* — Fernando Hidalgo
(74) *Attorney, Agent, or Firm* — Sughrue Mion, PLLC

(57) ABSTRACT

Provided are apparatus and methods for compensating fabrication process variation of on-chip component(s) in shared memory bank. The method includes tracking a flip voltage level and tracking a discharge leakage current to disconnect a keeper circuit from the local read bit-line. The method includes controlling a read current and the discharge leakage current based on determining at least one of fast transistor and slow transistor associated with the at least one the keeper circuit and a bit-cell.

20 Claims, 10 Drawing Sheets

APPARATUS AND METHODS FOR COMPENSATING FOR VARIATIONS IN FABRICATION PROCESS OF COMPONENT(S) IN A MEMORY

CROSS-REFERENCE TO RELATED APPLICATION

This application claims priority to Indian Patent Application No. 2019-41041746, filed on Oct. 15, 2019, in the Indian Patent Office, the disclosure of which is incorporated herein by reference in its entirety.

BACKGROUND

1. Field

Example embodiments of the present disclosure relate to bit-line sensing memory devices and more particularly to an apparatus and methods for compensating for variations in the fabrication process of on-chip component(s) in a shared memory bank architecture.

2. Description of Related Art

Currently, fin field-effect transistors (finFET) can be implemented to achieve higher system on-chip density and better speed. However, a fin FET shaves a greater variation in chip fabrication process. The chip fabrication process variation can cause issues in single ended bit-line sensing memories, due to different types of pull down device and keeper devices. The conventional keeper circuit/devices which include only p-type Metal Oxide Semiconductor (PMOS) transistors may possess difficultly in keeping track of n-type Metal Oxide Semiconductor (NMOS) transistors due to process variation in the bit-cells of memories.

In addition, if a bit-cell is a slow device and the keeper circuit is a faster device, then it may be difficult to meet the robustness criteria for read current. Similarly, if the bit-cell is a faster device and the keeper circuit is a slow device, then, it may be difficult to meet the robustness criteria for discharge leakage especially at lower voltages (i.e. an iread/ileak ratio is low). In lower voltages, one of the currents (keeper current or bit-cell current) may evolve as dominant over the other current, depending upon the keeper circuit size and number of PMOS transistor stacks.

FIGS. 1a, 1b and 1c illustrate a block diagram of a related art shared memory bank architecture. The related art shared memory bank architecture includes blocks such as a pull down circuit bit-cell top, a pull down circuit bit-cell bottom, a top keeper circuit pull up, a bottom keeper circuit pull up and an output block. FIG. 1b is a circuit diagram of the pull down bit-cell top block. FIG. 1c is a circuit diagram of the top keeper circuit pull up block.

When a clock signal is triggered, the bit-line may start to discharge if the data stored is 1. The pull up device (i.e., keeper circuit) tries to pull the bit-line up using the top keeper circuit pull up block. Further, when the bit-line is discharging and the output (i.e., NAND logic gate) trips, the NAND may turn off the keeper circuit though a feedback and read operation is occurring. In addition, when the data stored is 0, the bit-line may discharge because of leakage of the bit-line and other bit-cells in the memory and the keeper circuit may be required to supply enough current to keep the bit-line at voltage VDD, to perform the read operation correctly.

However, due to process variations, if the NMOS transistor associated with the bit-cell is slow and the PMOS transistor associated with the keeper circuit is fast, then the keeper current may start to dominate the bit-cell current, thereby resulting in performance degradation and less yield of usable bit-cells. Further, if the NMOS transistor associated with the bit-cell is fast and the device is leaky, then the keeper circuit may need to be stronger to support the slower PMOS transistor stack.

FIG. 2 illustrates a circuit diagram of a related art keeper circuit. The logic gate may be used for feedback in the keeper to cut-off current supply to the keeper after significant discharge of a bit-line, to reduce dynamic power changes during a read operation. Further, the clocked keeper enable signal may be provided to enable/disable a keeper circuit according to user requirements. The stacked PMOS transistors may be used to improve the keeper current. The related art keeper circuit may include an NMOS transistor, and the NMOS transistor may be used for tracking of process variations.

However, the related art keeper circuits may not appropriately track the leakage current of bit-cells and may not appropriately track fabrication process variations of the sensing circuit or output logic gates.

SUMMARY

One or more example embodiments provide an apparatus and methods for compensating for variations in the fabrication process of on-chip components in a shared memory bank architecture.

One or more example embodiments also provide an apparatus and methods for tracking fabrication process variations in a bit-cell and a sensing circuit.

One or more example embodiments also provide an apparatus and methods for controlling a bit-line using a keeper circuit based on variations in the tracked process.

According to an aspect of an example embodiment, there is provided an apparatus for compensating for variations in a fabrication process of on-chip components in a shared memory bank including a top memory bank and a bottom memory bank, the apparatus including: a sensing circuit; and a keeper circuit. The keeper circuit includes: a first p-type Metal Oxide Semiconductor (PMOS) transistor coupled to an output terminal of the sensing circuit, wherein the output terminal of the sensing circuit provides a feedback signal to the first PMOS transistor; an n-type Metal Oxide Semiconductor (NMOS) transistor coupled to the first PMOS transistor, wherein the NMOS transistor is configured to track a first discharge leakage current in a top memory bit-cell of the top memory bank and a second discharge leakage current in a bottom memory bit-cell of the bottom memory bank based on the feedback signal; and a plurality of second PMOS transistors coupled to the NMOS transistor, wherein the plurality of second PMOS transistors are coupled to a top local read bit-line (lrbl) or a bottom lrbl, wherein the top lrbl permits read data access of the top memory bit-cell and the bottom lrbl permits read access of the bottom memory bit-cell based on receiving a control signal. At least one of the PMOS transistor, the NMOS transistor and the plurality of second PMOS transistors is configured to compensate for variations in the fabrication process by at least one of connecting, disconnecting, and controlling at least one of the PMOS transistor, the NMOS transistor and the plurality of second PMOS transistors, based on the feedback signal of the sensing circuit and the tracked first discharge leakage current of the top memory bit-cell and the tracked second discharge leakage current of the bottom memory bit-cell.

According to an aspect of another example embodiment, there is provided a method for compensating for variations in a fabrication process of on-chip components in a shared memory bank including a top memory bank and a bottom memory bank, the method including: connecting, by a first p-type Metal Oxide Semiconductor (PMOS) transistor, a keeper circuit to a power supply line based on a feedback signal received from a sensing circuit; tracking, by an n-type Metal Oxide Semiconductor (NMOS) transistor of the keeper circuit, wherein the NMOS transistor is coupled to the first PMOS transistor, a first discharge leakage current in a top memory bit-cell of the top memory bank; controlling, by a plurality of second PMOS transistors coupled to the NMOS transistor and a top local read bit-line (lrbl) and a bottom lrbl, a read data access of the top memory bank and a read data access of the bottom memory bank, based on receiving a control signal; and compensating, by at least one of the PMOS transistor, the NMOS transistor and the plurality of second PMOS transistors, variations in the fabrication process by at least one of connecting, disconnecting, and controlling at least one of the PMOS transistor, the NMOS transistor and the plurality of second PMOS transistors, based on the feedback signal of the sensing circuit and tracked first discharge leakage current of the top memory bit-cell and a tracked second discharge leakage current of a bottom memory bit-cell.

BRIEF DESCRIPTION OF THE DRAWINGS

The above and/or other aspects will become apparent and more readily appreciated from the following description of example embodiments, taken in conjunction with the accompanying drawings, in which.

DETAILED DESCRIPTION

Figure 1A:
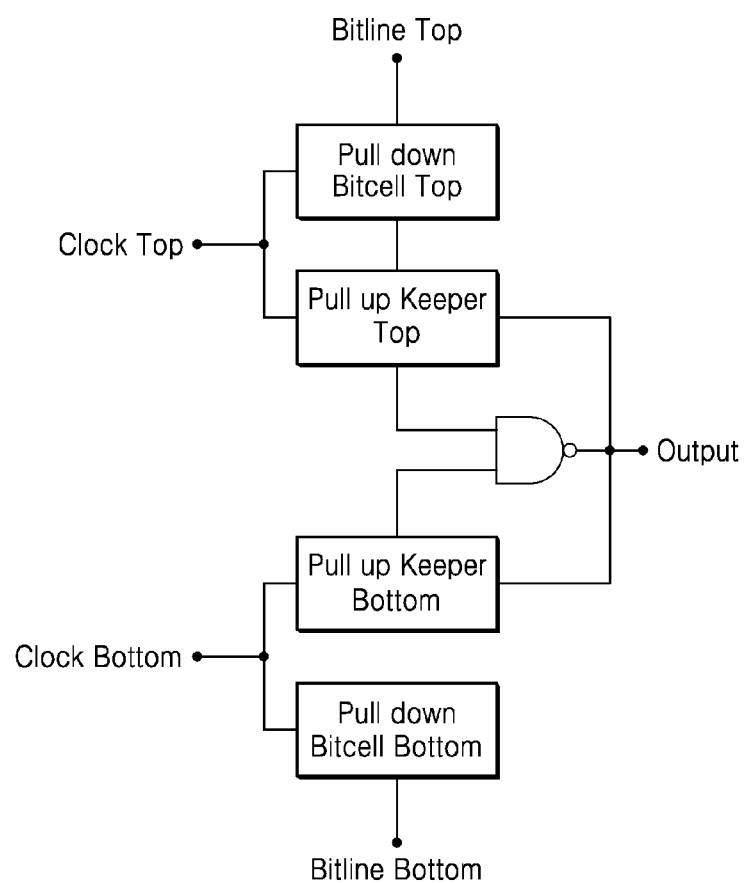
FIGS. 1a, 1b and 1c, illustrate block diagrams of a related art shared memory bank architecture.
Figure 1B:
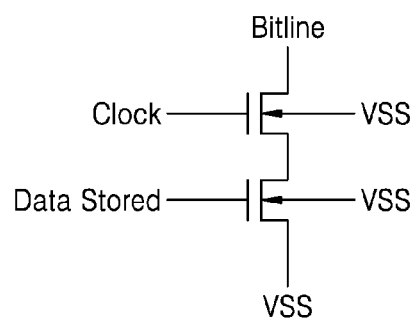
Figure 1C:
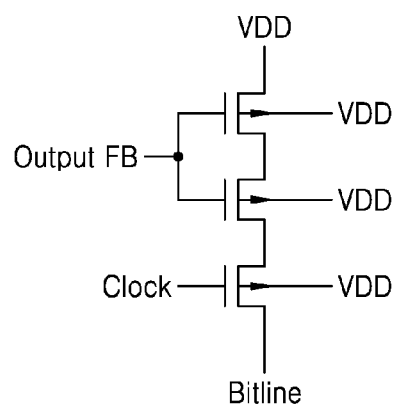
Figure 2:
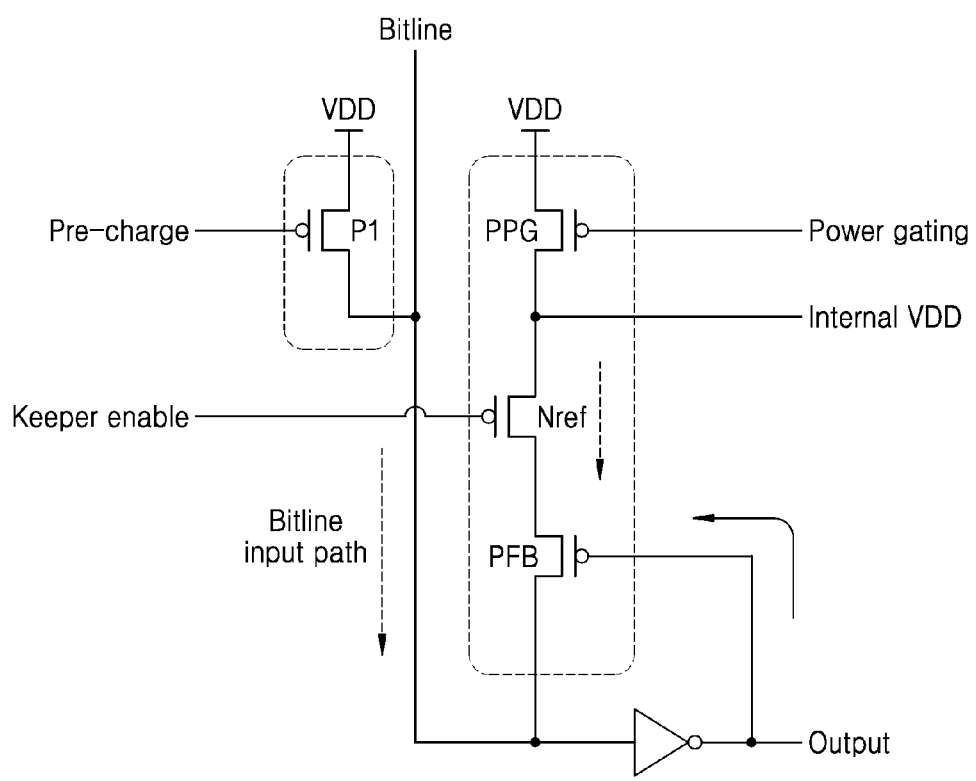
FIG. 2 illustrates a circuit diagram of a related art keeper circuit.

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The embodiments herein achieve an apparatus and methods for compensating for variations in the fabrication process of on-chip components in a shared memory bank architecture. Referring now to the drawings, and more particularly to FIGS. 3 through 6c, where similar reference characters denote corresponding features consistently throughout the figures, there are shown example embodiments.

Figure 3:
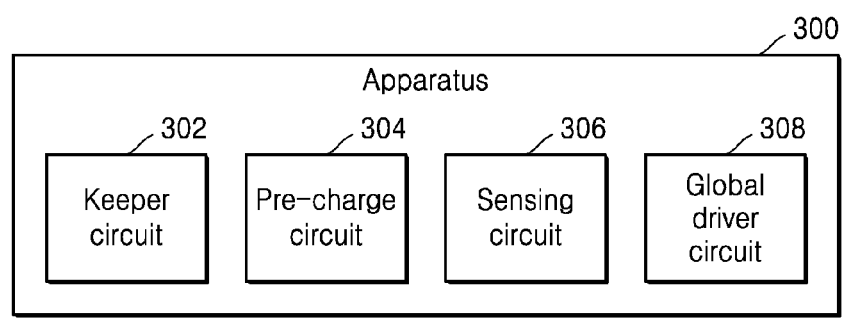
FIG. 3 illustrates a block diagram of an apparatus for compensating fabrication process variations of on-chip components in a shared memory bank architecture, according to an example embodiment.

FIG. 3 illustrates a block diagram of an apparatus 300 for compensating fabrication process variation of on-chip components in a shared memory bank architecture, according to an example embodiment.

In accordance with one or more example embodiments, a memory system such as single ended bit-line memories may include a plurality of memory cells and an apparatus 300 coupled to the memory cells. The apparatus 300 may provide at least one of a bit-line signal or a word-line signal to one or more of the memory cells, to allow access to the one or more memory cells for a read operation or a write operation. For example, the read and write operation signal such as an RWL signal and a WWL signal can be generated by the apparatus 300, based on whether a read operation or a write operation is to be performed in the next cycle. The apparatus 300 can activate the bit-line or the word-line signal based on the RWL signal and/or the WWL signal.

The write/read word-lines and bit-lines can be formed in a single metal track. The bit-line/word-line driver can be included as part of a repeating group of cells and may be utilized in the single ended bitline sensing memories. The integrated circuit provided in accordance with interconnection techniques of embodiments herein, can be employed in any application and/or electronic system utilizing memory, without regard to whether the memory is embedded or standalone (e.g., discrete memory). Examples of suitable systems for implementing the embodiments herein may include, but not limited to, personal computer(s), communication network(s), portable communications device(s) (e.g., mobile, smart phones), multi-user computing apparatus, workstation(s), gaming console(s), graphics system(s), camera(s), embedded control system(s), Internet of Things (IoT) device(s), vehicle infotainment system(s), wearable devices, and so on.

Examples of memory includes at least one of, but not limited to, a static RAM (SRAM), a dynamic RAM (DRAM), a Synchronous Dynamic RAM (SDRAM), a Dual In-line Memory Module (DIMM), a Small Outline In-line Memory Module (SO-DIMM), a Video RAM (VRAM), a double-data-rate memory (DDR), a Graphics DDR (GDDR), an Error-correcting code memory (ECC), a Content Addressable Memory (CAM), Register Files (RF), a First in First Out (FIFO) memory, a Read only Memory (ROM), a Virtual Read Only Memory (VROM), a cache memory, a level cache memory, a volatile memory, a non-volatile memory, a flash memory, a solid-state memory, an optical RAM, and so on.

Although, the example embodiments described herein may be implemented using finFETs, which may be formed using a Complementary Metal Oxide Semiconductor (CMOS) fabrication process, it is to be appreciated that example embodiments herein, are not limited to such transistor devices and/or such a fabrication process, and the other suitable devices, such as, for example, finFETs, bipolar junction transistors (BJTs), etc., and/or fabrication processes (e.g., bipolar, Bi-CMOS, etc.), may be similarly employed, with or without modification to the integrated circuits as described in the example embodiments herein. Moreover, although example embodiments herein are typically fabricated in a silicon wafer, example embodiments herein can alternatively be fabricated in wafers comprising other materials, including but not limited to Gallium Arsenide, Indium Phosphide, and so on.

Accordingly, a system on chip (SoC) according to example embodiments herein may include a first power circuit, a second power circuit, a power controller (not shown) and an SRAM, a reference voltage generating circuit and so on. Further, the first power circuit may generate a cell driving voltage VDDCE. The cell driving voltage VDDCE can be used for driving memory cells of the single ended bitline sensing memories. The first power circuit may generate the cell driving voltage VDDCE using an internal voltage of the system on chip or may use a voltage provided from an external device. Furthermore, if the voltage is supplied from the external device is lower than the cell driving voltage VDDCE, then the first power circuit may ramp up the cell driving voltage VDDCE using a boosting circuit, such as a charge pump circuit and so on. Moreover, if the voltage supplied from the external device is higher than the cell driving voltage VDDCE, then the first power circuit may ramp up the cell driving voltage VDDCE using a down converting circuit. Further, the word-line voltage VDDWL and the ground voltage VSSE may also be ramped up and fed to the apparatus 300.

The single bit-line sensing memory may further include level shifter circuits, row decoders (RDEC), control blocks, control inputs, data inputs, data outputs and an input/output (IO) block. Further, the arrays in the memory can be arranged in rows and columns of memory cells called word-lines and bit-lines, respectively. Each memory cell may have a unique location or address defined by the bit line or word line.

Referring to FIG. 3, the apparatus 300 may include a keeper circuit 302, a pre-charge circuit 304, a sensing circuit 306 and a global driver circuit 308.

The apparatus 300 may include at least one bitline and a bitline input path. The bitline may also include a read bitline (rbl) or a global read bitline (grbl), or a local read bit line (lrbl). In various implementations, the bitline may be coupled to a memory, such as, e.g., read-only memory (ROM), a register file, etc., and the bitline may be used to read one or more bits and/or bytes in the memory. The pre-charge circuit 304 may be coupled to the bitline through the bitline input path. The pre-charge circuit 304 may be configured to provide a first voltage source signal (i.e. VDDWL) to the bitline input path based on a Read Pre-Charge (RPCH) enable signal. The pre-charge circuit 304 may include at least one P-type Metal-Oxide-Semiconductor (PMOS) transistor coupled to the bitline or bitline input path. The top PMOS transistor in the pre-charge circuit 304 may be configured to provide the voltage source signal to the bitline based on a Read Pre-Charge Top (RPCH_T) enable signal. The Read Pre-Charge Top (RPCH_T) enable signal is provided as the voltage source signal to the bitline/LRBLT. Similarly, the bottom PMOS transistor in the pre-charge circuit 304 may be configured to provide the first voltage source signal to the bitline based on a Read Pre-Charge Bottom (RPCH_B) enable signal. Read Pre-Charge Bottom (RPCH_B) enable signal is provided as the voltage source signal to the bitline/LRBLB.

The keeper circuit 302 of the apparatus 300 is coupled to the bitline and the output of the sensing circuit 306. The keeper circuit 302 may also be configured to provide a voltage source signal (e.g., VDDCE) to the bitline/bitline input path based on a keeper enable signal. The keeper circuit 302 may include at least one of an n-type Metal Oxide Semiconductor (NMOS) transistor and a p-type Metal Oxide Semiconductor (PMOS) transistor. In an example embodiment, the NMOS transistor may include a Fin-shaped Field Effect Transistor (FinFET). The apparatus 300 may include a logic device (i.e. sensing circuit 306) coupled to the bitline. The logic device may be configured to receive the bitline input signal, receive the voltage source signal (from transistor Q3/LRBLT and transistor Q6/LRBLB) from the pre-charge circuit 304, receive voltage source signal (from transistor Q4/Q5) from the keeper circuit 302, and provide an inverted bitline input signal as an output signal. The logic device can also act as a sensing circuit 306. The logic device can be at least one of, but not limited to, a NAND gate, NOR gate, and so on.

The feedback signal from the sensing circuit 306 (VOUT) may activate or deactivate the keeper circuit 302 or a keeper path, based on the polarity of the output signal of the sensing circuit 306. The keeper path can be a path between at least one of the n-type Metal Oxide Semiconductor (NMOS) transistor and the p-type Metal Oxide Semiconductor (PMOS) transistor, within the keeper circuit 302. For instance, when the sensing circuit 306 flips, a bitline read of the memory may be completed, and the value may have been determined. The keeper circuit 302 may be configured to track leakage in either or both of the Top bit line and the Bottom bit line. The keeper circuit 302 may provide tracking that may work in any situation and in any process corner, voltage, and temperature. The bitline may be kept in balance with use of the NMOS transistor in the keeper circuit 302. In some embodiments, "balance" means that the keeper circuit maintains a bit line at a high voltage when the corresponding memory cell has provided a high voltage to the bit line, but the keeper circuit does not pull a bit line to a high voltage when the corresponding memory cell has provided a low voltage to the bit line. In the keeper circuit 302, the NMOS transistor may be connected in a fashion similar to connection of a diode. The NMOS transistor may track a variation in a bit-cell (a memory cell storing one bit), as the bit-cell devices connected to bitline may be of N-type. Accordingly, the keeper circuit 302 may counter the impact of leakage from the bitline and thereby the keeper circuit 302 may keep the bitline balanced.

In an example embodiment, the apparatus 300 may be configured to track the flip voltage level of the sensing circuit 306 for cutting-off the keeper circuit 302 during a read operation associated with the shared memory bank, via at least one of a local read bit-line. In an example embodiment the apparatus 300 may be configured to track the discharge leakage current in a memory bit-cell associated with at least one of the local read bit-line, during read operation associated with the shared memory bank. In an example embodiment, the apparatus 300 is configured to control an access to a top memory bank and a bottom memory bank associated with the shared memory bank, based on at least one of disconnecting and connecting at least one of the local read bit-line form the keeper circuit 302. In an example embodiment, the apparatus 300 is configured to receive a Read Pre-Charge (RPCH) signal for providing a voltage signal to at least one of the local read bit-line. In an example embodiment, the apparatus 300 is configured to output a complemented global read bit-line signal corresponding to at least one of the local read bit-line signal. In an example embodiment, the apparatus 300 is configured to drive the complemented global read bit-line signal to the shared memory bank. In an example embodiment, the apparatus 300 is configured to determine, if at least one of the top memory bank and the bottom memory bank is being accessed. In an example embodiment, the apparatus 300 is configured to switch-off the Read Pre-Charge (RPCH) of the pre-charge circuit 304 corresponding to the top memory bank and switch-on the Read Pre-Charge (RPCH) of the pre-charge circuit 304 corresponding to the bottom memory bank, if the top memory bank is being accessed. In an example embodiment, determining that the at least one of the top memory bank and the bottom memory bank is accessed, based on a memory bank information in an enable keeper signal. The memory bank information comprises information regarding which memory bank of the at least one of the top memory bank and the bottom memory bank to access. In an example, a part of an address decoding or an input address (i.e. the selection of word-line to access the memory bank) may be decoded to determine which memory bank is accessed or about to be accessed.

In an example embodiment, the apparatus 300 is configured to switch-off the Read Pre-Charge (RPCH) of the pre-charge circuit 304 corresponding to the bottom memory bank and switch-on the Read Pre-Charge (RPCH) of the pre-charge circuit 304 corresponding to the top memory bank, if the bottom memory bank is being accessed. In an example embodiment, compensating the fabrication process variation of the on-chip components comprises managing a read current and the discharge leakage current of the bit-cell based on determining at least one of fast transistor and slow transistor associated with the at least one the keeper circuit 302 and the bit-cell. In an example embodiment, the keeper circuit 302 is further configured to manage a keeper current based on the determined at least one of fast transistor and slow transistor associated with the bit-cell. During fabrication, if the N type devices becomes faster, the bit-cell may become faster and may result in more leakage current. However, the NMOS transistor in the keeper circuit 302 stack may also become faster and hence may counter the leakage current by providing more current. Similarly, if the N type devices become slower, the bit-cell ON current may be reduced, thereby degrading the performance. However, the NMOS transistor in the keeper circuit 302 stack may slow down the keeper current for tracking the bit-cell.

In an example embodiment, the NMOS transistor is configured to receive an enable keeper signal as a voltage signal to control the keeper circuit 302. In an example embodiment, the second PMOS transistor is configured to receive the Read Pre-Charge (RPCH) signal for enabling a voltage signal from the local read bit-line to the input of the sensing circuit 306. In an example embodiment, the flip voltage level of the sensing circuit 306 comprises an output voltage level of the sensing circuit 306 with respect to the bit-cell discharge leakage current and the keeper current. The bit-cell discharge leakage current can occur due to leakage power and low voltage or OFF current. In an example embodiment, the Read Pre-Charge (RPCH) signal comprises at least one of a top Read Pre-Charge (RPCH_T) signal and a bottom Read Pre-Charge (RPCH_B) signal.

The example embodiments herein can comprise hardware and software elements. The example embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

Figure 4:
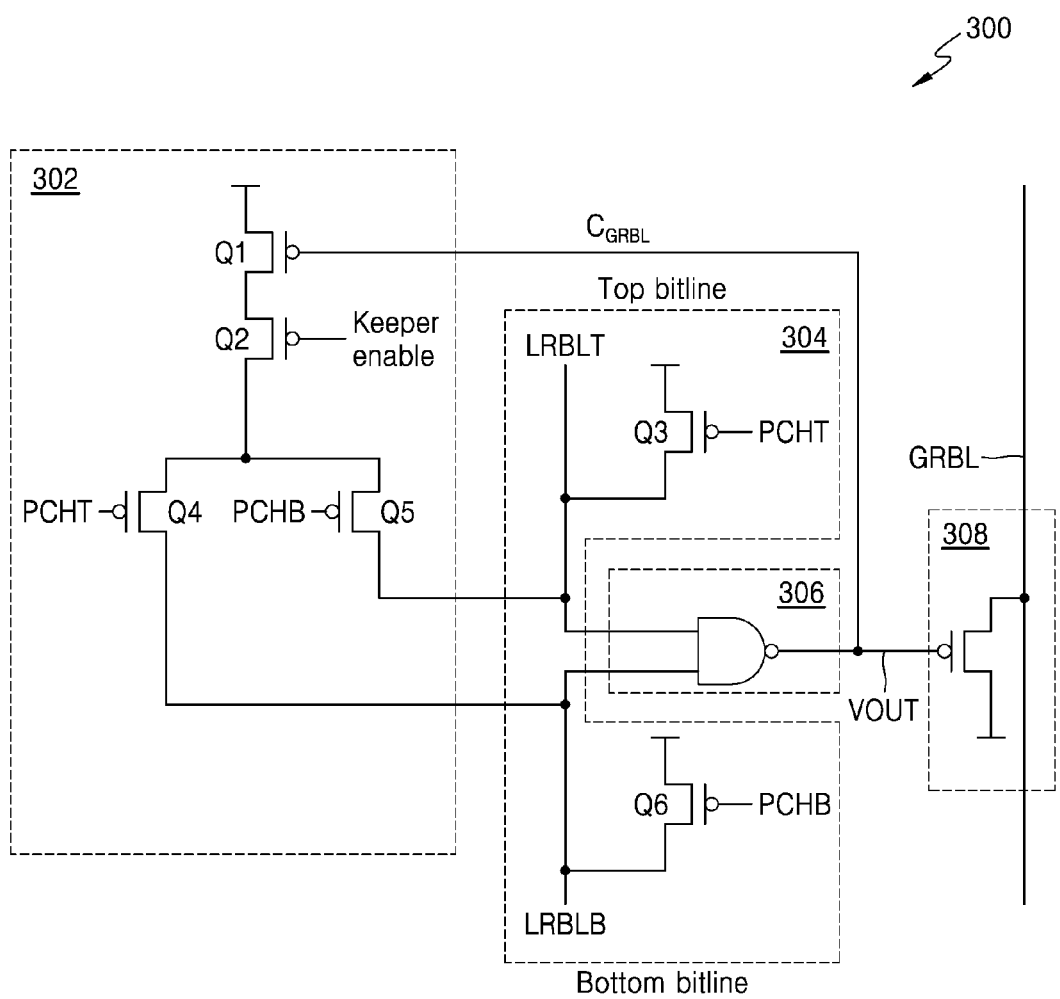
FIG. 4 illustrates a circuit diagram of an apparatus for compensating fabrication process variations of on-chip components in a shared memory bank architecture, according to an example embodiment.

FIG. 4 illustrates a circuit diagram of apparatus 300 for compensating fabrication process variation of on-chip components in shared memory bank architecture, according to an example embodiment.

The pair of memory banks may share the common NAND gate shown in the sensing circuit 306. For example, the NAND gate in the keeper circuit 302 may be the sensing circuit 306. Further, based on the voltage on bit-lines, "top bit line" and "bottom bit line" of FIG. 4, connected as inputs to the sensing circuit 306, the sensing circuit 306 may generate the output (VOUT). The signal may be split, that is, VOUT can be a different signal for each top memory bank and the bottom memory bank. While accessing the top memory bank, the pre-charge for the top bank can be switched-off at Q3 and the pre-charge for the bottom memory bank can be switched-on at Q6. The process of controlling the pre-charge can be a cross couple method. The pre-charge from the bottom memory bank can be used to conduct the keeper current from the top memory bank. The top pre-charge current to the PMOS transistor Q3 of keeper circuit 302 may disconnect keeper circuit 302 from the bottom bit-line. Similarly, while accessing the bottom memory bank, the pre-charge for the bottom memory bank can be switched-off at Q6 and the pre-charge for the top memory bank can be switched-on at Q3. For example, consider a case in which the NMOS transistor Q1 in the keeper circuit 302 has input with value 1; then, the source and drain are at a VDD voltage and the transistor is in a default state. Further, consider that a bit-line is leaking current and the bit line is slowly starting to discharge. The Read Pre-Charge bottom (RPCH_B) to one of the PMOS in the pre-charge circuit 304 (Q6) may be switched-on, since the top memory bank is accessed. In a corresponding fashion, if the bottom memory bank is accessed, Q3 may be switched on.

For example, when the top memory bank is accessed, the leakage condition can be as below:
RPCH_B=0, RPCH_T=VDD, lrbl_T=VDD, lrbl_B=VDD, $C_{grbl}$=0, grbl=VDD, kpr_en=VDD.
wherein, RPCH_B is bottom Read Pre-Charge, RPCH_T is top Read Pre-Charge, lrbl_T is top local read bitline, lrbl_B is bottom local read bit line, $C_{grbl}$ is global read bit line complimentary, grbl is global read bit line, kpr_en is keeper enable signal (for example, in FIG. 4, controlling Q2).

In another example, when the top memory bank is accessed, the discharge condition can be as below:
RPCH_B=0, RPCH_T=VDD, lrbl_T=0; lrbl_B=VDD, $C_{grbl}$=VDD, grb=0, kpr_en=VDD.
wherein, RPCH_B is bottom Read Pre-Charge, RPCH_T is top Read Pre-Charge, lrbl_T is top local read bitline (for example, attached to Q3 in FIG. 4), lrbl_B is bottom local read bit line (for example, attached to Q6 in FIG. 4), $C_{grbl}$ is global read bit line complimentary, grbl is global read bit line, kpr_en is keeper enable signal (for example, in FIG. 4, controlling Q2).

Figure 5:
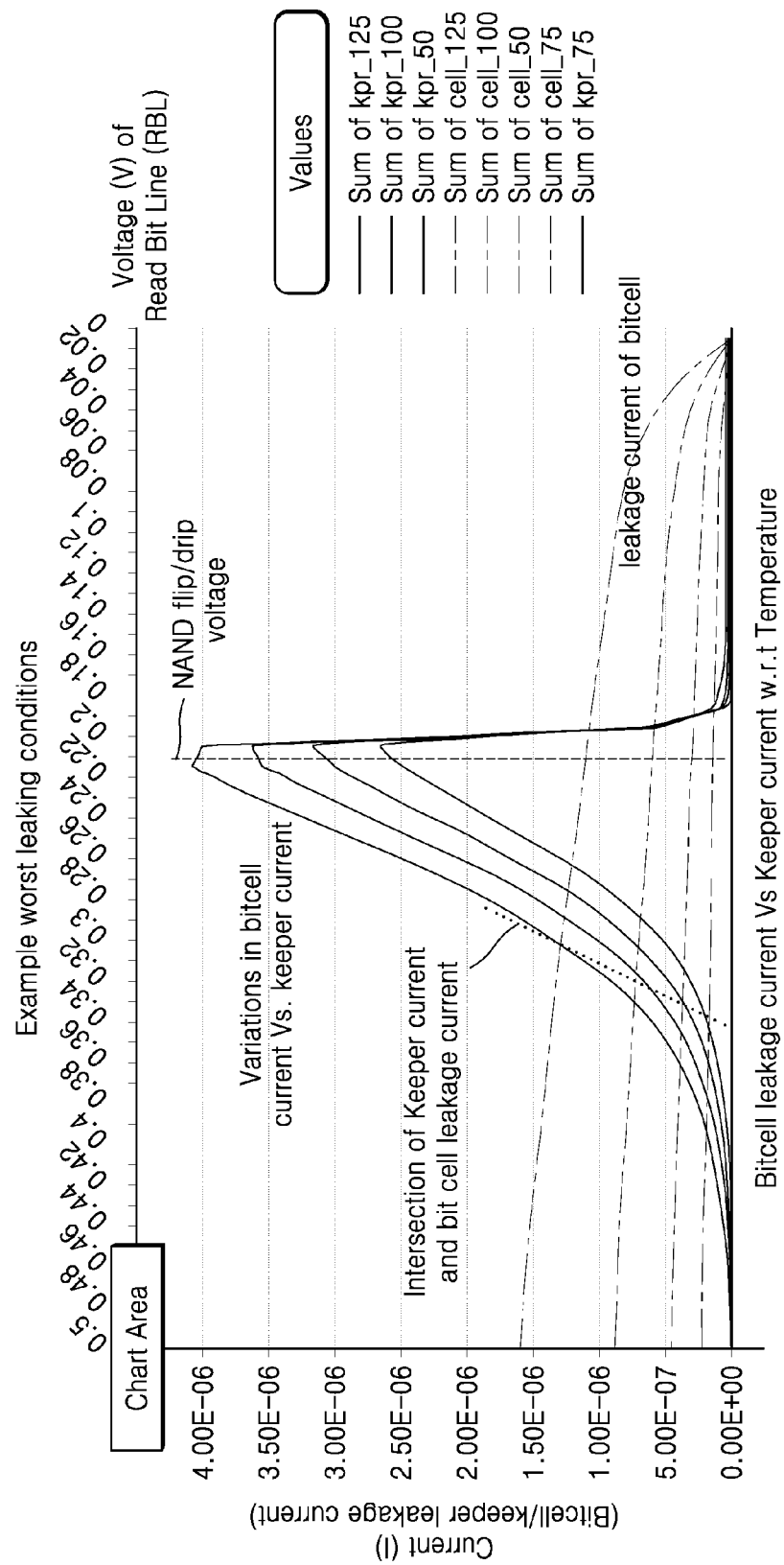
FIG. 5 illustrates a graph for bit-cell leakage current Vs. keeper current with respect to temperature variation, according to embodiments as disclosed herein.

FIG. 5 illustrates a graph for bit-cell leakage current vs. keeper current with respect to temperature variation, according to an example embodiment.

The keeper current with respect to the bit-cell leakage current is changed linearly for change in temperature. The bit-cell leakage current is tracked with better performance. The solid curves and the dotted curves in the graph represents variation in the bitcell current Vs. keeper current (i.e. keeper curve) and leakage current of the bitcell respectively. Accordingly, if the voltage increases then the keeper current discharges/keeper current varies. Further, whenever, the bitcell leakage current is increased, the keeper circuit 302 is compensating the bitcell leakage current. As the sensing circuit 306 (i.e. NAND gate) receives to one of the input voltage nearing to zero (as shown in graph, at voltage 0.2), then the NAND gate will flip/drip (shown in graph with vertical dotted line), which in turn turns off the keeper circuit 302. As the keeper circuit 302 receives Vout via Q1, from the sensing circuit 306. When the keeper circuit 302 is turned off, the current is decreasing as shown in the graph. In an example, the top memory bank is accessed and the bit-cell is storing a zero (0) voltage in discharge case, then the lrbl_T may drop from VDD voltage to zero (0) voltage once the RWL is turned on. Further, if the lrbl_T drops to zero voltage the output of NAND gate increases to VDD, as the lrbl_T is connected as an input to NAND gate.

In another example, the top memory bank is accessed and the bit-cell is storing a one (1) voltage in leakage case, then the lrbl_T may slightly decrease from VDD voltage, due to leakage in bit-cells once the RWL is turned on. Further, if the lrbl_T voltage is dropping to zero voltage, the keeper circuit 302 may provide current to make sure the lrbl_T can stay close to VDD voltage so that the read operation is performed correctly. As the lrbl_T is connected as input to the NAND gate, the output of NAND gate may stay at zero (0) voltage. Furthermore, the lrbl_B can be at VDD voltage in both the discharge case and leakage case, as RPCH_B will be on zero (0) voltage.

In an example, initially the keeper circuit 302 will be ON, and the bitline/wordline stops discharging due to the leakage from the bitcell. The keeper circuit 302 will provide support to the bitline. Considering, the apparatus 300 depicted in FIG. 4, the LRBLT/LRBLB in the pre-charge circuit 304 (i.e. bitcell) will be high and slowly discharges due to leakage in the bitcell (as depicted with curved dotted lines). While the current in the pre-charge circuit 304 is decreasing, one of the input to the sensing circuit 306 (i.e. NAND) will have low input (i.e. zero) and the sensing circuit is enabled and will drip (as depicted in graph with vertical dotted line). The drip voltage or Vout voltage from the sensing circuit 306 is transmitted to the transistor Q1 in the keeper circuit 302. The transistor Q1 will be turned off due to VDD voltage and the Vout voltage at gate form the sensing circuit 306. Accordingly, the keeper circuit is turned off due to the transistor Q1 is turned off. For instance, when the sensing circuit 306 flips, a bitline read of the memory may be completed, and the value may have been determined. The keeper circuit 302 may be configured to track leakage in either or both of the Top bit line and the Bottom bit line. Accordingly, the keeper circuit 302 may counter the impact of leakage from the bitline and thereby the keeper circuit 302 may keep the bitline balanced.

Accordingly, the NAND flip voltage can be defined as the voltage on the bit-line which is discharging at the point, when NAND gate input is equal to NAND gate output (i.e. when NAND gate output toggles).

Figure 6A:
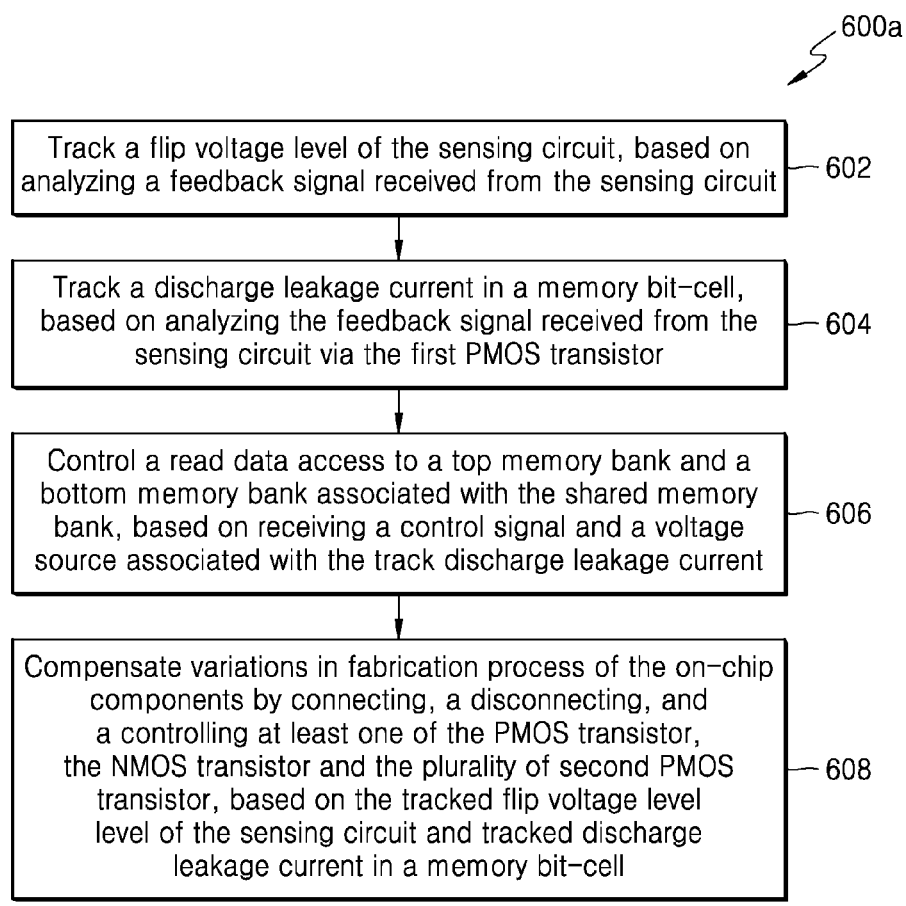
FIG. 6a is a flow chart depicting a method for compensating variations in fabrication process of an on-chip components in shared memory bank architecture comprising a keeper circuit, according to an example embodiment.

FIG. 6a is a flow chart depicting a method 600a for compensating for variations in fabrication process of on-chip components in shared memory bank architecture comprising the keeper circuit 302, according to an example embodiment.

At operation 602, the method 600a includes tracking, by a first p-type Metal Oxide Semiconductor (PMOS) transistor communicatively coupled to an output terminal of a sensing circuit 306, a flip voltage level of the sensing circuit 306, based on analyzing a feedback signal received from the sensing circuit 306. At operation 604, the method 600a includes tracking, by a n-type Metal Oxide Semiconductor (NMOS) transistor communicatively coupled to the first PMOS transistor, a discharge leakage current in a memory bit-cell, based on analyzing the feedback signal received from the sensing circuit 306 via the first PMOS transistor. At operation 606, the method 600a includes controlling, by a plurality of second PMOS transistors communicatively coupled to the NMOS transistor and at least one of a local read bit-line (lrbl), a read data access to a top memory bank and a bottom memory bank associated with the shared memory bank, based on receiving a control signal and a voltage source signal associated with the track discharge leakage current. At operation 608, the method 600a includes compensating, by at least one of the PMOS transistor, the NMOS transistor and the plurality of second PMOS transistor, variations in fabrication process of the on-chip components by at least one of a connecting, a disconnecting, and a controlling at least one of the PMOS transistor, the NMOS transistor and the plurality of second PMOS transistor, based on the tracked flip voltage level of the sensing circuit 306 and tracked discharge leakage current in a memory bit-cell.

The various actions in method 600a may be performed in the order presented, in a different order or simultaneously. Further, in some example embodiments, some actions listed in FIG. 6a may be omitted.

Figure 6B:
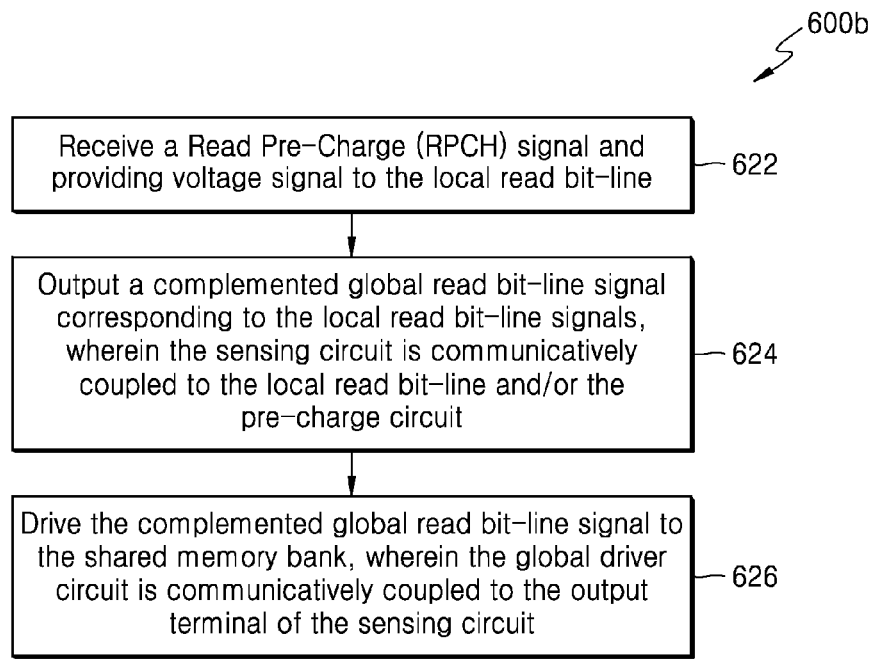
FIG. 6b is a flow chart depicting a method for driving a complemented global read bit-line signal to the shared memory bank, according to an example embodiment.

FIG. 6b is a flow chart depicting a method 600b for driving a complemented global read bit-line signal to the shared memory bank, according to an example embodiment.

At operation 622, the method 600b includes receiving, by a pre-charge circuit 304, a Read Pre-Charge (RPCH) signal and for providing voltage signal to at least one of the local read bit-line, wherein the pre-charge circuit 304 is communicatively coupled to an input terminal of the sensing circuit 306 and at least one of the local read bit-line. At operation 624, the method 600b includes outputting, by the sensing circuit 306, a complemented global read bit-line signal corresponding to at least one of the local read bit-line signal, wherein the sensing circuit 306 is communicatively coupled to at least one of the local read bit-line and the pre-charge circuit 304. At operation 626, the method 600b includes driving, by a global driver circuit 308, the complemented global read bit-line signal to the shared memory bank, wherein the global driver circuit (308) is communicatively coupled to the output terminal of the sensing circuit 306.

The various actions in method 600b may be performed in the order presented, in a different order or simultaneously. Further, in some example embodiments, some actions listed in FIG. 6b may be omitted.

Figure 6C:
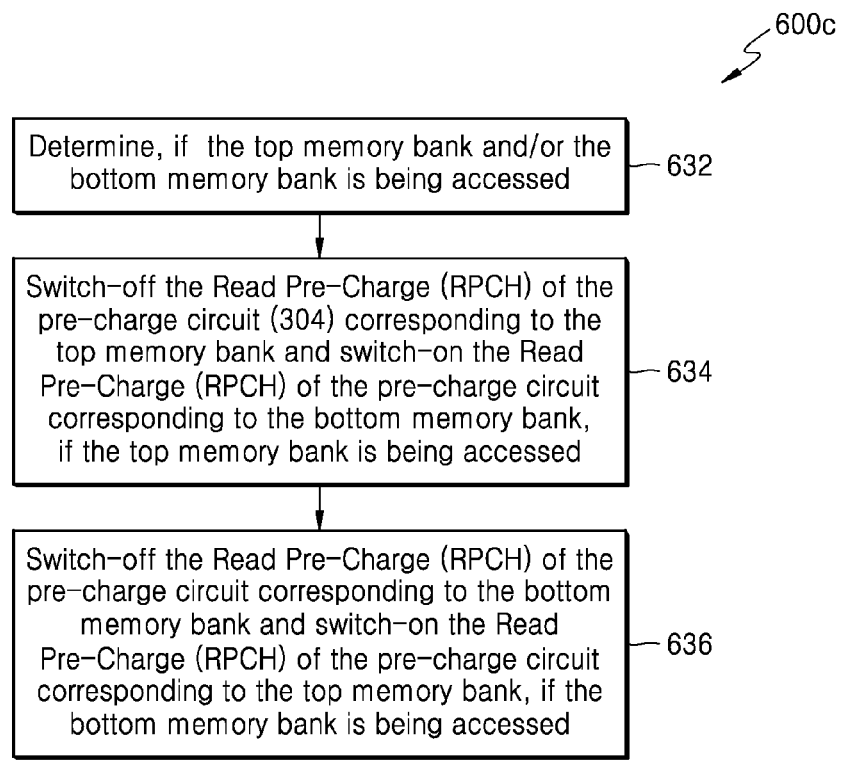
FIG. 6c is a flow chart depicting a method for controlling the access of shared memory bank, according to an example embodiment.

FIG. 6c is a flow chart depicting a method 600c for controlling the access of shared memory bank, according to an example embodiment.

At operation 632, the method 600c includes receiving, by a pre-charge circuit 304, a Read Pre-Charge (RPCH) signal and for providing voltage signal to at least one of the local read bit-lines. At operation 634, the method 600c includes outputting, by the sensing circuit 306, a complemented global read bit-line signal corresponding to at least one of the local read bit-line signal. At operation 636, the method 600c includes driving, by a global driver circuit 308, the complemented global read bit-line signal to the shared memory bank The various actions in method 600c may be performed in the order presented, in a different order or simultaneously. Further, in some example embodiments, some actions listed in FIG. 6c may be omitted.

Example embodiments herein may significantly improve discharge rate of bit-cell as compared to conventional PMOS transistor stacked keeper circuit. Example embodiments herein may use lesson-chip area as less number of devices is used. Example embodiments herein may provide better robustness to counter between keeper current and bit-cell current.

The example embodiments disclosed herein can be implemented through at least one software program running on at least one hardware device and performing network management functions to control the elements. The elements shown in FIG. 3 can be at least one of a hardware device, or a combination of hardware device and software module.

While example embodiments have been described with reference to the figures, it will be understood by those of ordinary skill in the art that various changes in form and details may be made therein without departing from the spirit and scope as defined by the following claims.

What is claimed is:

1. An apparatus for compensating for variations in a fabrication process of on-chip components in a shared memory bank including a top memory bank and a bottom memory bank, the apparatus comprising:
    a sensing circuit; and
    a keeper circuit, wherein the keeper circuit comprises:
        a first transistor coupled to an output terminal of the sensing circuit, wherein the sensing circuit provides a feedback signal to the first transistor;
        a second transistor coupled to the first, transistor;
        a third transistor coupled to the second transistor; and
        a fourth transistor coupled to the second transistor,
        wherein the third transistor is configured to track a first discharge leakage current in a top memory bit-cell of the top memory bank, and the fourth transistor is configured to track a second discharge leakage current in a bottom memory bit-cell of the bottom memory bank based on the feedback signal,
        wherein the third transistor is coupled to a bottom local read bit line (lrbl), the fourth transistor is coupled to a top lrbl, and the top lrbl permits read data access of the top memory bit-cell and the bottom lrbl permits read access of the bottom memory bit-cell based on receiving a control signal, and
        wherein at least one of the first transistor, the second transistor, the third transistor, and the fourth transistor is configured to compensate for variations in the fabrication process by at least one of connecting, disconnecting, and controlling at least one of the first transistor, the second transistor, the third transistor, and the fourth transistor, based on the feedback signal of the sensing circuit and the tracked first discharge leakage current of the top memory bit-cell and the tracked second discharge leakage current of the bottom memory bit-cell.

2. The apparatus as claimed in claim 1, wherein the apparatus further comprises:
    a pre-charge circuit configured to receive a Read Pre-Charge (RPCH) signal and provide a voltage signal to at least one of the top lrbl and the bottom lrbl, the pre-charge circuit being coupled to an input terminal of the sensing circuit, wherein the sensing circuit is configured to provide a complemented global read bit-line signal, corresponding to the top lrbl or the bottom lrbl, as the feedback signal, and wherein the sensing circuit is coupled to the top lrbl and the bottom lrbl and to the pre-charge circuit; and
    a global driver circuit configured to drive the complemented global read bit-line signal to the shared memory bank, wherein the global driver circuit is communicatively coupled to the output terminal of the sensing circuit.

3. The apparatus as claimed in claim 1, wherein the apparatus is configured to:
    determine whether at least one of the top memory bank and the bottom memory bank is being accessed based on a memory bank information in an enable keeper signal, wherein the memory bank information comprises information regarding which memory bank of the at least one of the top memory bank and the bottom memory bank to access;
    switch-off a Read Pre-Charge (RPCH) of a pre-charge circuit corresponding to the top memory bank and switch-on a RPCH of the pre-charge circuit corresponding to the bottom memory bank, based on the top memory bank being accessed; and
    switch-off the RPCH of the pre-charge circuit corresponding to the bottom memory bank and switch-on the RPCH of the pre-charge circuit corresponding to the top memory bank, based on the bottom memory bank being accessed.

4. The apparatus as claimed in claim 1, wherein the second transistor is configured to use an enable keeper signal to control the keeper circuit.

5. The apparatus as claimed in claim 1, wherein the third transistor and the fourth transistor are configured to receive a Read Pre-Charge (RPCH) signal for pre-charging the top lrbl or the bottom lrbl.

6. The apparatus as claimed in claim 1, wherein an output voltage level of the sensing circuit depends on the first discharge leakage current.

7. The apparatus as claimed in claim 1, wherein the RPCH signal comprises a top Read Pre-Charge (RPCH_T) signal and a bottom Read Pre-Charge (RPCH_B) signal.

8. A method for compensating for variations in a fabrication process of on-chip components in a shared memory bank including a top memory bank and a bottom memory bank, the method comprising:
    connecting a keeper circuit to a power supply line based on a feedback signal received from a sensing circuit;
    tracking a first discharge leakage current in a top memory bit-cell of the top memory bank;
    controlling a top local read bit-line (lrbl) and a bottom lrbl, a read data access of the top memory bank and a read data access of the bottom memory bank, based on receiving a control signal; and
    compensating variations in the fabrication process based on the feedback signal of the sensing circuit and tracked first discharge leakage current of the top memory bit-cell and a tracked second discharge leakage current of a bottom memory bit-cell.

9. The method as claimed in claim 8 further comprising:
    receiving, by a pre-charge circuit, a Read Pre-Charge (RPCH) signal, wherein the pre-charge circuit is configured to provide a voltage signal to at least one of the top lrbl and the bottom lrbl, and wherein the pre-charge circuit is coupled to an input terminal of the sensing circuit;

outputting, by the sensing circuit, a complemented global read bit-line signal, corresponding to the top lrbl or the bottom lrbl, is the feedback signal of the sensing circuit, wherein the sensing circuit is coupled to the top lrbl and the bottom lrbl and to the pre-charge circuit; and driving, by a global driver circuit, the complemented global read bit-line signal to the shared memory bank, wherein the global driver circuit is coupled to an output terminal of the sensing circuit.

10. The method as claimed in claim 8 further comprising:
determining, by the keeper circuit, whether at least one of the top memory bank and the bottom memory bank is being accessed based on a memory bank information in an enable keeper signal, wherein the memory bank information comprises information regarding which memory bank of the at least one of the top memory bank and the bottom memory bank to access;

switching-off, by the keeper circuit, a Read Pre-Charge (RPCH) of a pre-charge circuit corresponding to the top memory bank and switch-on an RPCH of a pre-charge circuit corresponding to the bottom memory bank, based on the top memory bank being accessed; and switching-off, by the keeper circuit, the RPCH of the pre-charge circuit corresponding to the bottom memory bank and switching-on the RPCH of the pre-charge circuit corresponding to the top memory bank, based on the bottom memory bank being accessed.

11. The method as claimed in claim 8, wherein the keeper circuit receives an enable keeper signal that is used to control the keeper circuit.

12. The method claimed in claim 8, wherein the keep circuit receives a Read Pre-Charge (RPCH) signal for pre-charging the top lrbl or the bottom lrbl.

13. The method as claimed in claim 8, wherein an output voltage level of the sensing circuit depends on the first discharge leakage current.

14. The method as claimed in claim 9, wherein the RPCH signal comprises a top Read Pre-Charge (RPCH_T) signal and a bottom Read Pre-Charge (RPCH_B) signal.

15. A compensation circuit comprising:
a sensing circuit configured to provide a feedback signal;
a keeper circuit configured to track a first discharge leakage current in a top memory bit-cell and a second discharge leakage current in a bottom memory bit-cell based on the feedback signal and configured to control a plurality of transistors based on the feedback signal and the tracked first discharge leakage current and the tracked second discharge leakage current;

a pre-charge circuit configured to receive a Read Pre-Charge (RPCH) signal and provide a voltage signal to at least one of a top local read bit-line (lrbl) and a bottom lrbl; and a global driver circuit configured to drive a complemented global read bit-line signal, wherein the global driver circuit is coupled to the output terminal of the sensing circuit.

16. The compensation circuit of claim 15, wherein
the pre-charge circuit is coupled to an input terminal of the sensing circuit,
the sensing circuit is coupled to the top lrbl and the bottom lrbl and to the pre-charge circuit,
the global driver circuit is coupled to the output terminal of the sensing circuit,
the sensing circuit is further configured to provide the complemented global read bit-line signal, corresponding to the top lrbl or the bottom lrbl, as the feedback signal, and
the global driver circuit is further configured to drive the complemented global read bit-line signal to a shared memory bank.

17. The compensation circuit of claim 15, wherein the compensation circuit is further configured to:
determine whether at least one of a top memory bank and a bottom memory bank is being accessed based on a memory bank information in an enable keeper signal, wherein the memory bank information comprises information regarding which memory bank of the at least one of the top memory bank and the bottom memory bank to access;
switch-off a RPCH of a pre-charge circuit corresponding to the top memory bank and switch-on a RPCH of the pre-charge circuit corresponding to the bottom memory bank, based on the top memory bank being accessed; and
switch-off the RPCH of the pre-charge circuit corresponding to the bottom memory bank and switch-on the RPCH of the pre-charge circuit corresponding to the top memory bank, based on the bottom memory bank being accessed.

18. The compensation circuit of claim 15, wherein the second transistor is configured to use an enable keeper signal to control the keeper circuit.

19. The compensation circuit of claim 15, wherein a plurality of bit-line transistors are configured to receive a Read Pre-Charge (RPCH) signal for pre-charging the top lrbl or the bottom lrbl.

20. The compensation circuit of claim 15, wherein an output voltage level of the sensing circuit depends on the first discharge leakage current.

* * * * *